United States Patent
Itakura et al.

(10) Patent No.: US 7,279,728 B2
(45) Date of Patent: Oct. 9, 2007

(54) VARIABLE CAPACITANCE DEVICE WITH HIGH ACCURACY

(75) Inventors: Toshikazu Itakura, Toyota (JP); Toshiki Isogai, Nagoya (JP)

(73) Assignees: DENSO CORPORATION, Kariya (JP); NIPPON SOKEN, INC., Nishio (JP)

( * ) Notice: Subject to any disclaimer, the term of this patent is extended or adjusted under 35 U.S.C. 154(b) by 87 days.

(21) Appl. No.: 11/151,440

(22) Filed: Jun. 14, 2005

(65) Prior Publication Data
US 2005/0285221 A1 Dec. 29, 2005

(30) Foreign Application Priority Data
Jun. 23, 2004 (JP) .............................. 2004-185314

(51) Int. Cl.
*H01L 21/8242* (2006.01)

(52) U.S. Cl. ............... 257/232; 257/374; 257/E21.019; 257/E21.261; 438/241; 438/253

(58) Field of Classification Search ................ 257/232, 257/374; 438/241, 253
See application file for complete search history.

(56) References Cited

U.S. PATENT DOCUMENTS

| | | | |
|---|---|---|---|
| 6,013,958 A | | 1/2000 | Aytur |
| 6,077,738 A * | | 6/2000 | Lee et al. .................... 438/241 |
| 6,528,366 B1 * | | 3/2003 | Tu et al. ...................... 438/253 |
| 6,580,600 B2 | | 6/2003 | Toyoda et al. |
| 7,057,881 B2 * | | 6/2006 | Chow et al. ................. 361/508 |
| 2001/0004227 A1 | | 6/2001 | Frech et al. |
| 2002/0114125 A1 | | 8/2002 | Toyoda et al. |
| 2003/0002238 A1 * | | 1/2003 | Toyoda ........................ 361/302 |
| 2003/0010119 A1 | | 1/2003 | Toyoda |

FOREIGN PATENT DOCUMENTS

| | | |
|---|---|---|
| DE | EP 1042769 | 10/2000 |
| FR | 2 687 834 | 2/1992 |
| GB | 2 091 038 A | 7/1982 |
| JP | A-S63-164351 | 7/1988 |
| JP | A-H01-110764 | 4/1989 |
| JP | A-H10-190160 | 7/1998 |
| WO | WO 99/33075 | 7/1999 |

OTHER PUBLICATIONS

Office Action from German Patent Office issued on Sep. 14, 2006 for the corresponding German patent application No. 102005028935.5 (a copy and English translation thereof).

* cited by examiner

*Primary Examiner*—Steven Loke
*Assistant Examiner*—Dao H. Nguyen
(74) *Attorney, Agent, or Firm*—Posz Law Group, PLC

(57) ABSTRACT

A capacitance device includes a dielectric film, the first electrode and the second electrode. One of the two electrodes is divided into a plurality of electrode portions. Each of the divided electrode portions is connected with each other through switching transistors so that appropriate portions contributing to the capacitance can be selected. The device can vary its capacitance with high accuracy.

11 Claims, 3 Drawing Sheets

VARIABLE CAPACITANCE DEVICE WITH HIGH ACCURACY

CROSS REFERENCE TO RELATED APPLICATION

This application is based on Japanese Patent Application No. 2004-185314 filed on Jun. 23, 2004, the disclosure of which is incorporated herein by reference.

FIELD OF THE INVENTION

The present invention relates to a variable capacitance device with high accuracy.

BACKGROUND OF THE INVENTION

A capacitance device with a dielectric film and a pair of electrodes, the capacitance of which can be adjusted, is disclosed, for example, in Japanese Patent Application Publication No. H10-190160 and French Patent Application No. 2687834. FIG. 4 is a plan view of a capacitance device 90 disclosed in Japanese Patent Application Publication No. H10-190160. The capacitance device 90 includes a dielectric film 93, the first electrode 92 and the second electrode 94. The first electrode 92 is formed on a ceramic substrate 91 and the dielectric film 93 is formed on the first electrode 92. Then, the second electrode 94, which has a narrow portion 94a formed by a trimming method, is formed on the dielectric film 93. The first electrode 92, the dielectric film 93 and the second electrode 94 are all formed by a printing method. In the capacitance 90, since the narrow portion 94a having narrow width is formed in the second electrode 94, the trimming process time for forming the narrow portion 94a can be reduced. Thus, the damage caused to the dielectric film 93 by laser trimming process can be reduced.

However, it is impossible to remove completely the damage caused by the laser trimming process. Further, in general, the laser trimming process takes much time and increases the cost of manufacturing the capacitance device 90. Furthermore, after the capacitance is adjusted, it is difficult to change the capacitance again.

SUMMARY OF THE INVENTION

In view of the above-described problem, it is an object of the present invention to provide a variable capacitance device with high accuracy.

The capacitance device includes a dielectric film, a first electrode and a second electrode. At least one of the two electrodes is divided into a plurality of electrode portions. Each of the electrode portions is connected with each other through a switching transistor.

In the capacitance device, appropriate electrode portions contributing to the capacitance can be selected from all of the electrode portions by the switching transistor. Therefore, the capacitance can be adjusted easily and accurately without laser trimming process. Thus, the manufacturing cost is reduced. The electrical adjustment of the capacitance using the switching transistor can be performed not only in the manufacturing process but also after the manufacturing process. Thus, the electrical adjustment can be performed even when the device is operated as a product. Therefore, the capacitance of the capacitance device can be adjusted accurately and appropriately. Further, the device can be manufactured at low cost and without damage caused by the laser trimming process.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
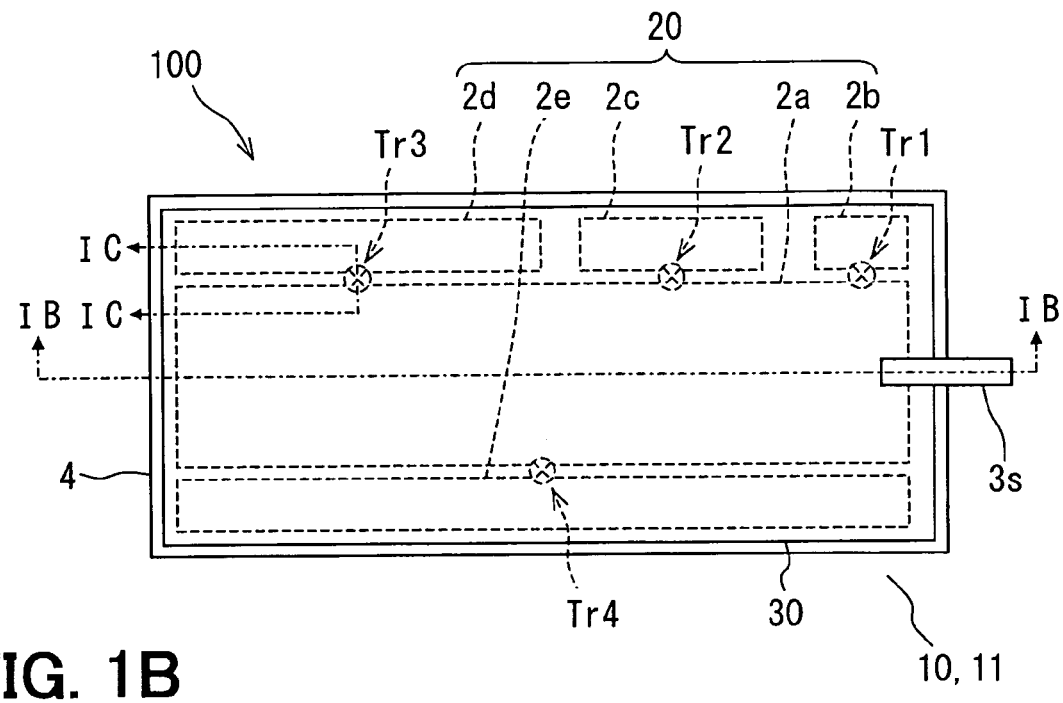
FIG. 1A is a plan view showing a capacitance device according to a first embodiment of the present invention.
Figure 1B:
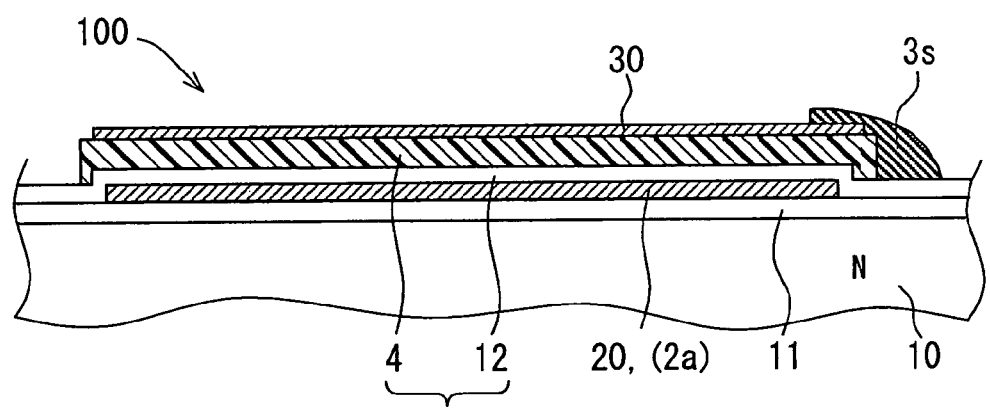
FIG. 1B is a cross sectional view showing the device taken along line IB-IB in FIG. 1A.
Figure 1C:
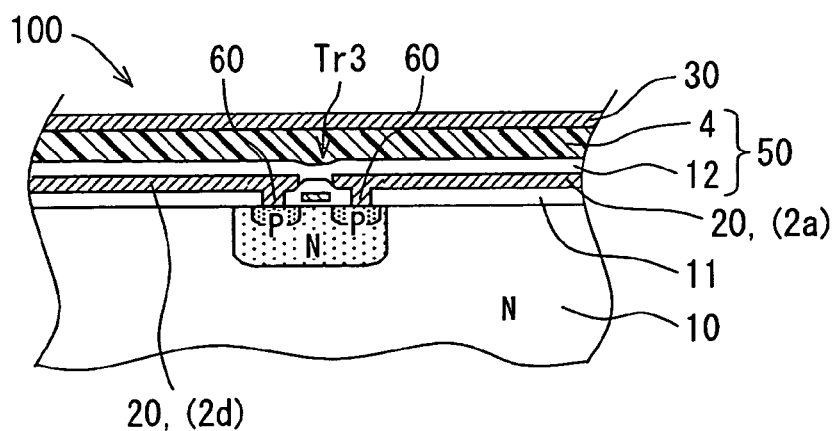
FIG. 1C is a cross sectional view showing the device taken along line IC-IC in FIG. 1A.

A capacitance device 100 according to a first embodiment of the present invention is shown in FIGS. 1A to 1C. The device 100 formed on a silicon semiconductor substrate 10 has stacked electrodes. The device 100 includes a dielectric layer 50, the first electrode 20 and the second electrode 30. The layer 50 is sandwiched between the first electrode 20 and the second electrode 30. The layer 50, the first electrode 20 and the second electrode 30 in FIGS. 1A to 1C are formed by a conventional semiconductor process, which includes a depositing process and a patterning process. The patterning process is composed of a photolithography process, a dry etching process, a wet etching process, and the like.

The device 100 is suitably used for a humidity sensor, the capacitance of which varies according to humidity. The dielectric layer 50 is a staked film of a silicon nitride film 12 and a polyimide film 4. The polyimide film 4, which is a humidity-sensitive film, is commonly used for the dielectric layer of a capacitance type humidity sensor. The dielectric constant of the film 4 varies significantly according to humidity. As described later, the silicon nitride film 12 is a protection film of a metal layer for a wiring layer 60 on the semiconductor substrate 10. The dielectric constant of the film 12 varies little according to humidity, compared with that of the polyimide film 4.

The first electrode 20 is formed together with the wiring layer 60 on the semiconductor substrate 10. Therefore, the silicon nitride film 12 is formed on the first electrode 20. An interlayer insulation film 11 is disposed on the semiconductor substrate 10 and made of silicon dioxide film. A connection member 3s is disposed on the second electrode 30, and made of metal paste and the like.

As shown in FIG. 1A, the first electrode 20, which is formed as a lower layer under the second electrode 30, is divided into multiple electrode portions 2a-2e and completely covered with the films 4, 12. The second electrode 30 is a one-piece electrode. The second electrode 30 as an upper layer is made of, for example, a porous metal so that the second electrode 30 has moisture permeability.

Each of the divided electrode portions 2a-2e of the first electrode 20 is connected with each other through switching transistors Tr1-Tr4. The transistors Tr1-Tr4 are placed directly below the first-electrode-to-be-formed region on the substrate 10. Consequently, comparing the case that the transistors Tr1-Tr4 are placed on a different region from the first-electrode-to-be-formed region, both the wiring layer 60 for connecting between the divided electrode portions 2a-2e and the transistors Tr1-Tr4 can be reduced. Further, the total area can be reduced.

As shown in FIG. 1C, the first electrode 20 is formed in the metal layer where the wiring layer 60 for connecting to the transistors Tr1-Tr4 is disposed. In a word, the wiring layer 60 is integrated with the first electrode 20. Therefore, the same process that is used to form the wiring layer 60 can provide the first electrode 20 simultaneously, without adding extra process to form the first electrode 20. Thus, the manufacturing cost of the capacitance device 100 is reduced. The silicon nitride film 12 of the device 100, which protects the metal layer on the substrate 10, is formed on the first electrode 20. This is because the first electrode 20 is formed by the same process that is used for forming the wiring layer 60.

In the device 100, appropriate electrode portions contributing to the capacitance can be selected from the divided electrode portions by switching the transistors Tr1-Tr4.

For example, one part of the first electrode 20 is divided into the electrode portion 2a with large area having a basic capacitance, and then, the rest portion of the first electrode 20 is divided into multiple electrode portions 2b-2e. The portions 2b-2e have capacitances multiplying the basic capacitance by 2 to the Nth power. Here, the N represents an integer. Specifically, when the capacitance of the portion 2a is defined as $C_B$, the capacitances of the other portions 2b-2e can be expressed as $2^N \times C_B$.

Then, with reference to the capacitance of the electrode portion 2a, an accurate adjustment of the capacitance can be performed by selecting appropriate combination of electrode portions from the portions 2a-2e by using the transistors Tr1-Tr4.

The device 100 is a stacked capacitance device having large capacitance, although the dimensions of the device are small. Therefore, a combination of dividing the electrodes and switching the transistors enables accurate adjustment of the capacitance of the capacitance device over a wide capacitance range. The capacitance device, which is a humidity sensor, using a polyimide film as a dielectric film, has an advantage of a large change in dielectric constant. However, the capacitance deviation in each device becomes larger, when the capacitance device having small capacitance is manufactured. The device 100, which enables the electrical adjustment of the capacitance by switching the transistors Tr1-Tr4, enables the setting of an accurate capacitance at the manufacturing stage. Thus, the device 100 is suitable for a humidity sensor with a polyimide film as a dielectric film.

The switching transistors Tr1-Tr4 are controlled by means of nonvolatile memory such as EPROM (Erasable Programmable Read-Only Memory). This is because, for example, when the adjustment data of the setting of the capacitance at the manufacturing stage is stored in nonvolatile memory, electrical adjusting method instead of a conventional laser trimming method, can be available. Without using the conventional laser trimming method, which causes damage to a device, the device 100 enables easy and accurate adjustment of the capacitance without damage.

The above electrical adjustment using the switching transistors Tr1-Tr4 can be made not only in the manufacturing process but also after the manufacturing process. Thus, the electrical adjustment can be performed even when the device is operated as a product.

Figure 2A:
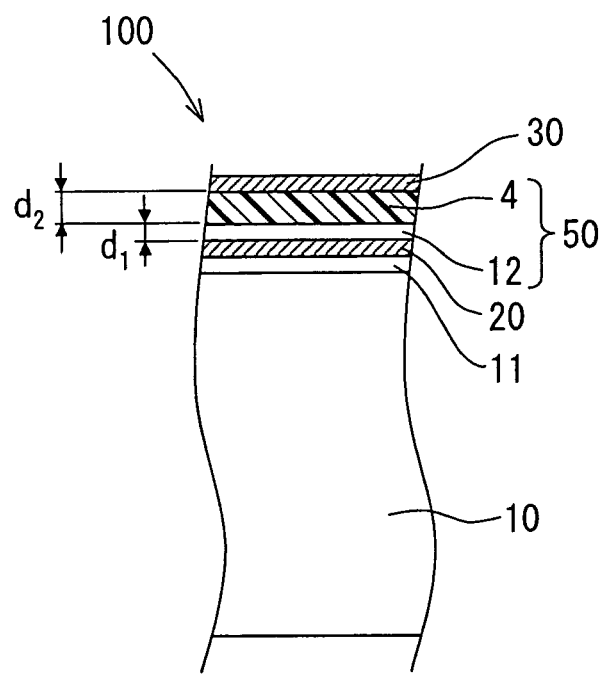
FIGS. 2A and 2B are cross sectional views explaining rate of change in capacitance together with temperature change, according to the first embodiment.
Figure 2B:
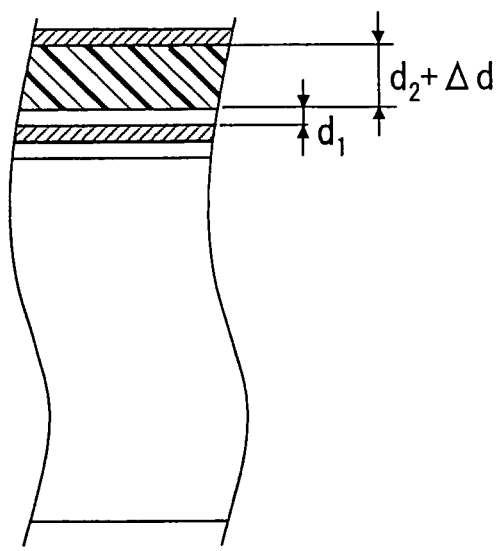

FIGS. 2A and 2B show a relationship between a capacitance change and a temperature in the capacitance device. In the device 100 with a stacked film composed of the silicon nitride film 12 and the polyimide film 4, since the thickness $d_1$ of the silicon film 12 is not changed substantially, the change in capacitance with change in temperature derived from the film 12 is negligible. However, when the film thickness is reduced, thermal expansion coefficient of the polyimide film 4 is not negligible. As shown in FIGS. 2A and 2B, for example, when the temperature rises from 5° C. to 55° C., the capacitance of the device 100 decreases corresponding to the thickness increment $\Delta d$ of the polyimide film 4 according to the following equation:

$$C = \varepsilon \cdot \frac{S}{d_2 + \Delta d}$$

where C represents the capacitance of the polyimide film 4; $\varepsilon$ represents the dielectric constant of the film 4; S represents the surface area of the film 4; $d_2$ represents the thickness of the film 4 at 5° C.; and $\Delta d$ represents the thickness increment of the film 4 when the temperature increases from 5° C. to 55° C.

The change in capacitance with change in temperature can be corrected in real time by controlling the transistors Tr1-Tr4 with monitoring temperature around the device 100. In this case, an electrically erasable nonvolatile memory can be used for controlling the transistors Tr1-Tr4.

Therefore, the device 100 can be the capacitance device that enables accurate and repeated adjustment of the capacitance. Further, the device is manufactured without damage and at lower cost.

Second Embodiment

Figure 3:
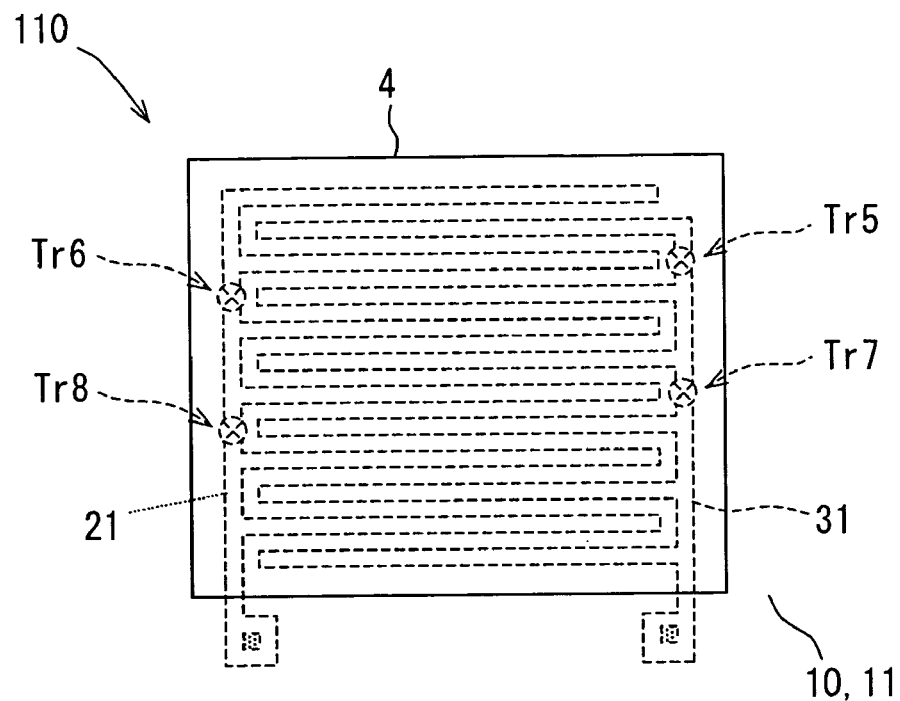
FIG. 3 is a plan view showing another capacitance device according to a second embodiment of the present invention.
Figure 4:
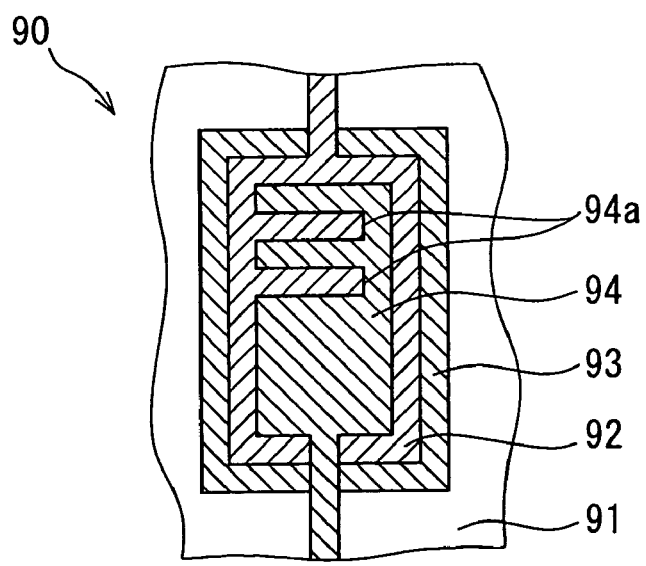
FIG. 4 is a plan view showing a conventional capacitance device according to a prior art.

A capacitance device 110 according to a second embodiment of the present invention is shown in FIG. 3.

The device 110 is a capacitance device with a pair of comb-teeth electrodes that includes the first comb-teeth electrode 21 and the second comb-teeth electrode 31. The two electrodes are covered with the polyimide film 4. Each of the two electrodes comprises a common electrode portion and multiple comb-teeth electrode portions extending from the common electrode portion in one direction. The two electrodes are disposed so as to be spaced from each other at a predetermined interval on the same plane. And then, the two electrodes are disposed so that the comb-teeth electrode portions of the electrode 21 and the comb-teeth electrode portions of the electrode 31 are alternately arranged with the predetermined interval.

The electrode 21 and the electrode 31 of the device 110 are divided into multiple portions that are connected with each other through the switching transistors Tr5-Tr8. The transistors Tr5-Tr8 are disposed directly below the electrode 21 and the electrode 31 on the semiconductor substrate. Comparing the case that the transistors Tr5-Tr8 are disposed on different region from the electrode 21 and the electrode 31, the wiring layer 60 for connecting between the divided electrode portions and the transistors Tr5-Tr8 can be shortened. Further, the total dimensions of the device can be reduced.

In the capacitance 110 shown in FIG. 3, the common electrode portions of the electrode 21 and the electrode 31 are divided, respectively, so that the capacitance can be adjusted over a wide capacitance range by switching the transistors Tr5-Tr8. Further, the comb-teeth electrode portions of the electrode 21 and the electrode 31 can be divided so that the capacitance can be finely adjusted by switching the transistors Tr5-Tr8. In the capacitance device with comb-teeth electrodes, similar to the capacitance device having stacked electrodes, the electrode 21 and the electrode 31 are divided into multiple electrode portions. One divided portion has a basic capacitance, and the other portions have capacitances multiplying the basic capacitance by 2 to the Nth power. The N represents an integer. Therefore, with reference to the basic capacitance, an accurate adjustment of the capacitance can be performed by selecting appropriate combination of electrode portions by using the transistors Tr5-Tr8.

The capacitance device 110 is suitably used for a humidity sensor, and has the polyimide film 4 as a dielectric film. The electrode 21 and the electrode 31 are formed in the same metal layer where the wiring layer 60 is disposed. In a word, the wiring layer 60 is integrated with the two electrodes. Therefore, the same process that is used to form the wiring layer 60 forms the two electrodes simultaneously, without adding extra process to form the two electrodes. Thus, the manufacturing cost of the device 110 can be reduced. The electrode 21 and the electrode 31 are covered with the polyimide film 4 through the silicon nitride film 12. The silicon nitride film 12 is a protection film for protecting the wiring layer 60.

Although the device 110 with comb-teeth electrodes has lower capacitance than the device 100 with stacked electrodes, the device 110 can be manufactured at lower cost than the device with stacked electrodes. That is because the electrode 21 and the electrode 31 can be formed at one time, and the device 110 has no second electrode 30, which requires specific depositing equipment for forming. Then, the device 110 with comb-teeth electrodes, which enables electrical adjustment of the capacitance by switching the transistors Tr5-Tr8, enables accurate and fine setting of the capacitance repeatedly, even if the capacitance device has low capacitance.

Therefore, the device 110 can be the capacitance device that enables accurate and repeated adjustment of the capacitance. Further, the device is manufactured without damage and at lower cost.

(Modifications)

Although the device 100 and 110 use a stacked film of the silicon nitride film 12 and the polyimide film 4 as a dielectric layer 50, single layered or multilayered dielectric film can be used in the device.

The dielectric layer 50 and the electrodes 20, 21, 30, 31 of the devices 100, 110 are formed by the manufacturing process, which includes a depositing process and a patterning process. The patterning process is composed of a photolithography process, a dry etching process and a wet etching process. In the capacitance device, further, the dielectric layer 50, the electrodes 20, 21, 30, 31 can be formed by screen-printing process. Furthermore, the dielectric layer 50, the electrodes 20, 21, 30, 31 can be formed on a given substrate except a semiconductor substrate, and then transistors formed on another substrate can be connected to the electrodes.

The device 100 and 110 are suitably used as a humidity sensor. An accurate setting capability of the capacitance is essential to a humidity sensor. This is because a humidity sensor measures change in capacitance value with change in humidity. Consequently, the capacitance device, which enables accurate setting of the capacitance repeatedly, is suitable for a humidity sensor. Further, the capacitance device can be used for any application except the above embodiment.

Such changes and modifications are to be understood as being within the scope of the present invention as defined by the appended claims.

What is claimed is:

1. A capacitance device comprising:
a first electrode;
a second electrode;
a switching transistor; and
a nonvolatile memory for storing adjustment data corresponding to a predetermined capacitance, wherein
one of the two electrodes is divided into a plurality of electrode portions, and
the switching transistor electrically connects the portions in accordance with the adjustment data to produce the predetermined capacitance between the first and second electrodes.

2. The device according to claim 1, further comprising:
a dielectric film sandwiched between the first electrode and the second electrode, wherein
the first electrode is divided into a plurality of electrode portions, and
the second electrode is a one-piece electrode.

3. The device according to claim 2, further comprising:
a substrate; and
a wiring layer, wherein
the first electrode, the dielectric film, the second electrode are respectively disposed on the substrate,
the switching transistor is disposed directly below the first electrode, and
the wiring layer for connecting the first electrode and the transistor is integrated with the first electrode.

4. The device according to claim 2, wherein
the device is a humidity sensor.

5. The device according to claim 4, wherein
the dielectric film is a polyimide film.

6. The device according to claim 4, wherein
the dielectric film is a stacked film of a silicon nitride film and a polyimide film.

7. The device according to claim 1, wherein
one of the first electrode and the second electrode is divided into a plurality of electrode portions by the transistor,
the portions include a basic portion having a basic capacitance defined as $C_B$,
the portions further include portions having capacitances defined as $2^N \times C_B$, and the N represents an integer.

8. The device according to claim 1, wherein
the nonvolatile memory monitors a temperature around the device and controls the transistor according to the detected temperature to correct a change in the predetermined capacitance between the first and second electrodes, the change in the predetermined capacitance being caused by a change in the detected temperature.

9. A capacitance device for monitoring temperature comprising:
a first electrode;
a second electrode, wherein one of the first electrode and the second electrode is divided into a plurality of electrode portions;
a stacked dielectric film sandwiched between the first electrode and the second electrode and formed from two films that have substantially different respective thermal expansion coefficients;

a memory for storing adjustment data corresponding to a predetermined capacitance; and a switching transistor for electrically connecting the plurality of electrode portions in accordance with the adjustment data to produce the predetermined capacitance between the first and second electrodes.

10. A capacitance device for monitoring humidity comprising:

a first electrode;

a second electrode, wherein one of the first electrode and the second electrode is divided into a plurality of electrode portions;

a stacked dielectric film sandwiched between the first electrode and the second electrode and formed from two films, wherein a capacitance of one film varies according to humidity, and a capacitance of the other film varies little according to humidity;

a memory for storing adjustment data corresponding to a predetermined capacitance; and a switching transistor for electrically connecting the plurality of electrode portions in accordance with the adjustment data to produce the predetermined capacitance between the first and second electrodes.

11. The device according to claim 10:

the first electrode is divided into the plurality of electrode portions; and the second electrode is a one-piece electiode made of a moisture permeable porous metal and is positioned on an upper layer of the device.

* * * * *